United States Patent
Kwon et al.

(10) Patent No.: US 8,895,384 B2
(45) Date of Patent: Nov. 25, 2014

(54) GATE STRUCTURES AND METHODS OF MANUFACTURE

(75) Inventors: Unoh Kwon, Fishkill, NY (US); Ramachandran Muralidhar, Mahopac, NY (US); Viorel Ontalus, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 13/293,210

(22) Filed: Nov. 10, 2011

(65) Prior Publication Data

US 2013/0119473 A1    May 16, 2013

(51) Int. Cl.
*H01L 21/8238* (2006.01)
*H01L 21/8234* (2006.01)

(52) U.S. Cl.
CPC *H01L 21/823807* (2013.01); *H01L 21/823857* (2013.01); *H01L 21/823842* (2013.01)
USPC .......................................... 438/230; 438/275

(58) Field of Classification Search
USPC .................. 438/275, 230; 257/368, E21.633, 257/E27.06, E21.618
See application file for complete search history.

(56) References Cited

U.S. PATENT DOCUMENTS

| | | | |
|---|---|---|---|
| 6,709,935 B1 | 3/2004 | Yu | |
| 6,784,507 B2 | 8/2004 | Wallace et al. | |
| 7,545,003 B2 | 6/2009 | Majhi et al. | |
| 7,602,013 B2 | 10/2009 | Miyano et al. | |
| 7,705,400 B2 | 4/2010 | Shimizu et al. | |
| 7,812,370 B2 | 10/2010 | Bhuwalka et al. | |
| 7,867,839 B2 | 1/2011 | Chen et al. | |
| 2006/0071285 A1* | 4/2006 | Datta et al. | 257/407 |
| 2006/0292762 A1 | 12/2006 | Borland et al. | |
| 2008/0079084 A1* | 4/2008 | Hanafi | 257/369 |
| 2009/0206416 A1* | 8/2009 | Cheng et al. | 257/369 |
| 2010/0081262 A1* | 4/2010 | Lim et al. | 438/479 |
| 2010/0112811 A1* | 5/2010 | Yeh et al. | 438/669 |
| 2011/0042758 A1 | 2/2011 | Kikuchi et al. | |
| 2012/0126310 A1* | 5/2012 | Yin et al. | 257/329 |

\* cited by examiner

*Primary Examiner* — Khiem D Nguyen
*Assistant Examiner* — Wilner Jean Baptiste
(74) *Attorney, Agent, or Firm* — Steven Meyers; Roberts Mlotkowski Safran & Cole, P.C.

(57) ABSTRACT

A metal gate structure with a channel material and methods of manufacture such structure is provided. The method includes forming dummy gate structures on a substrate. The method further includes forming sidewall structures on sidewalls of the dummy gate structures. The method further includes removing the dummy gate structures to form a first trench and a second trench, defined by the sidewall structures. The method further includes forming a channel material on the substrate in the first trench and in the second trench. The method further includes removing the channel material from the second trench while the first trench is masked. The method further includes filling remaining portions of the first trench and the second trench with gate material.

13 Claims, 6 Drawing Sheets

GATE STRUCTURES AND METHODS OF MANUFACTURE

FIELD OF THE INVENTION

The invention relates to semiconductor structures and methods of manufacture and, more particularly, to a metal gate structure with a silicon-germanium channel and methods of manufacturing.

BACKGROUND

A replacement metal gate (RMG) flow is a process to form metal gates. The process includes, for example, forming a dummy or sacrificial gate structure on a substrate, and thereafter removing the dummy or sacrificial gate structure to form the permanent metal gate structure.

In a high-k last process, channel stress materials, e.g., Ge, SiGe or SiC, can be first formed on the substrate, followed by deposition of sacrificial layers, e.g., dummy oxide, and dummy gate material, e.g., poly silicon. After the stress materials and sacrificial layers are deposited, they are then patterned to form discrete structures. Subsequent process flows include the formation of source and drain regions, and the removal of the sacrificial layers to form trenches. A metal gate process can then be performed, by depositing a high-k material within the trench and thereafter a metal material, or combinations of metal materials, to form the high-k metal gate structure. However, in such conventional RMG flows, the channel stress material, e.g., Ge, SiGe or SiC, becomes damaged or impaired due to the processing conditions in the subsequent process flows. This, in turn, will impair device performance. More specifically, thermal processes and implant processes, which include being exposed to different environment conditions such as temperature, pressure and gas, when forming and patterning of the sacrificial layers, will affect the quality of the channel stress material and its properties. Also, the removal of the sacrificial layers through etching processes are also known to attack the stress materials, which will also affect its qualities and its properties.

In a high-k first process, the RMG flow includes forming a high-k dielectric material on a substrate through a conventional deposition or growth process. A sacrificial material is then formed on the high-k dielectric material to form the dummy gate structure. The high-k dielectric material and the sacrificial material are then patterned to form discrete structures. Channel stress materials can be formed in the substrate to increase device performance. The stress materials can be, for example, Ge, SiGe or SiC. The channel stress materials can be formed prior to the deposition of the high-k material, or after the patterning process, depending on the process flow. In either scenario, the channel stress materials can be formed in the channel region or on the sides of the channel regions through a deposition or growth process. Thereafter, source and drain regions are formed in the substrate, through a doping or implantation process. The source and drain can also be formed using a doped epitaxial process. Subsequent process flows include the removal of the sacrificial material to form trenches. In this process, the channel material remains within the trenches. However, in such conventional RMG flows, the channel material, which may include the stress material, becomes damaged or impaired due to the processing conditions, similar to that discussed above. This, in turn, will impair device performance.

Accordingly, there exists a need in the art to overcome the deficiencies and limitations described hereinabove.

SUMMARY

In a first aspect of the invention, a method comprises forming dummy gate structures on a substrate. The method further comprises forming sidewall structures on sidewalls of the dummy gate structures. The method further comprises removing the dummy gate structures to form a first trench and a second trench, defined by the sidewall structures. The method further comprises forming a channel material on the substrate in the first trench and in the second trench. The method further comprises removing the channel material from the second trench while the first trench is masked. The method further comprises filling remaining portions of the first trench and the second trench with gate material.

In another aspect of the invention, a method comprises forming an insulator layer on a substrate and a sacrificial layer on the insulator layer. The method further comprises patterning the insulator layer and the sacrificial layer to form a plurality of dummy gate structures. The method further comprises forming sidewall structures on sidewalls of the dummy gate structures. The method further comprises removing the sacrificial layers from a first dummy gate structure and a second dummy gate structure to form a first trench and a second trench, respectively, defined by the sidewall structures. The method further comprises removing the insulator layer forming a bottom portion of the second trench while protecting the insulator layer in the first trench. The method further comprises forming a channel material on the substrate in the first trench while the insulator layer in the second trench acts as a mask in the second trench. The method further comprises removing the insulator layer in the second trench after the channel material is formed. The method further comprises filling remaining portions of the first trench and the second trench with gate material to form a metal gate in each of the first trench and the second trench.

In yet another aspect of the invention, a method comprises forming dummy gate structures on a substrate. The method further comprises forming sidewall structures on sidewalls of the dummy gate structures. The method further comprises removing the dummy gate structures to form a plurality of trenches, defined by the sidewall structures. The method further comprises forming a channel material in a first trench and a second trench. The method further comprises forming a thick oxide layer on the channel material in the first trench and the second trench, and on the substrate in a third trench and a fourth trench. The method further comprises removing the thick oxide layer from the second trench to expose the channel material and the fourth trench to expose the substrate. The method further comprises forming a thin oxide layer on the channel material in the second trench and the substrate in the fourth trench. The method further comprises filling remaining portions of the first trench, the second trench, the third trench and the fourth trench with gate material. The filling comprises: forming an insulating material in the first trench, the second trench, the third trench and the fourth trench; depositing a high-k dielectric material on the insulating material in the first trench, the second trench, the third trench and the fourth trench; and depositing metal materials on the high-k dielectric material in the he first trench, the second trench, the third trench and the fourth trench.

In yet another aspect of the invention, a device comprises a recess formed in a substrate and defining a portion of a first trench. The device further comprises a channel material formed on the substrate within the recess of the first trench.

The device further comprises a thick oxide layer formed on the channel material of the first trench. The device further comprises a first metal gate structure formed on the thick oxide layer of the first trench. The device further comprises a second metal gate structure formed on the substrate within a second trench. The channel material is material with high mobility of charge carriers. The first and second gate structures comprise: an insulating material; a high-k dielectric material; and one or more metal materials tailored for a designed work function.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the silicon-germanium channel in a replacement gate flow, which comprises the structures of the present invention. In still further embodiments, a method in a computer-aided design system is provided for generating a functional design model of the silicon-germanium channel in a replacement gate flow. The method comprises generating a functional representation of the structural elements of the silicon-germanium channel in a replacement gate flow.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a metal gate structure with a germanium (Ge) or silicon-germanium (SiGe) channel and methods of manufacturing. In embodiments, the present invention provides a Ge or SiGe channel (or other material with high mobility of charge carriers) formed during a later processing stage of gate formation, compared to conventional replacement metal gate formation processes. Advantageously, by forming the Ge or SiGe channel during a later processing stage, it is now possible to minimize any damage that may occur to the channel material, compared to conventional metal replacement gate processes. This, in turn, increases reliability, hole mobility, and allows for much more accurate tailored transistor threshold voltages. Additionally, by forming the Ge or SiGe channel at a later processing stage, the Ge or SiGe channel is not damaged by earlier processes and enables the Ge or SiGe properties to be well controlled.

Figure 1:
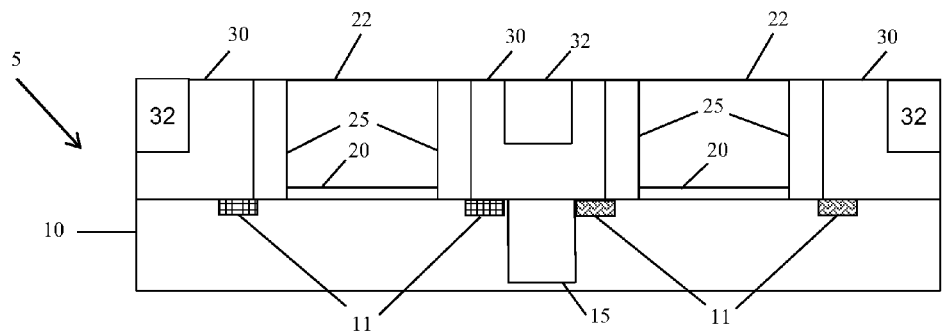
FIG. 1 shows an intermediate structure and respective processing steps in accordance with aspects of the present invention.

FIG. 1 shows an intermediate structure and respective processing steps in accordance with aspects of the present invention. More specifically, FIG. 1 shows a structure 5 having a substrate 10 with a shallow trench isolation (STI) 15. The substrate 10 can be any conventional substrate such as, for example, a Si based wafer. The STI 15 is formed by etching the substrate 10, depositing one or more dielectric materials, such as silicon dioxide ($SiO_2$) to fill the STI 15, and removing the excess dielectric material using a technique such as chemical-mechanical polishing (CMP), as is known to those of skill in the art. The dielectric material can be deposited using any well known deposition process, for example, chemical vapor deposition (CVD), atomic layer chemical vapor deposition (ALCVD), or plasma enhanced chemical vapor deposition (PECVD).

To form a dummy gate structure, an insulator layer 20 and a sacrificial poly layer 22 are deposited over the STI 15 and exposed portions of the substrate 10. The insulator layer 20 and sacrificial layer 22 can be deposited using any of the aforementioned deposition processes, in separate deposition processes. The sacrificial layer 22 and insulator layer 20 undergo a conventional patterning process to form dummy gate structures, which are removed during subsequent processes. The patterning process can include, for example, depositing a resist on the sacrificial layer 22, masking portions of the resist, and exposing the unmasked portions of the resist to light to form a pattern (e.g., openings). A reactive ion etching (RIE) will then follow to form the dummy gate structures.

In FIG. 1, after an optional cleaning, sidewall spacers 25 are formed on the dummy gate structures, e.g., patterned sacrificial layer 22 and insulator layer 20, using deposition processes, as discussed above. In embodiments, the sidewall spacers 25 are a nitride or other sidewall material such as, for example, an oxide based material, e.g., $SiO_2$. In conventional processes, a source and a drain 11 are formed at the portions of the substrate layer 10 below the dummy gate by ion implantation or other conventional doping techniques, e.g., using a doped epitaxial process. A nitride layer 30 is deposited over the spacers 25 and any exposed surfaces of the substrate 10. Subsequently, an insulating layer (ILD) 32 is deposited over the nitride layer 30, and planarized using CMP to expose the dummy gates.

Figure 2:
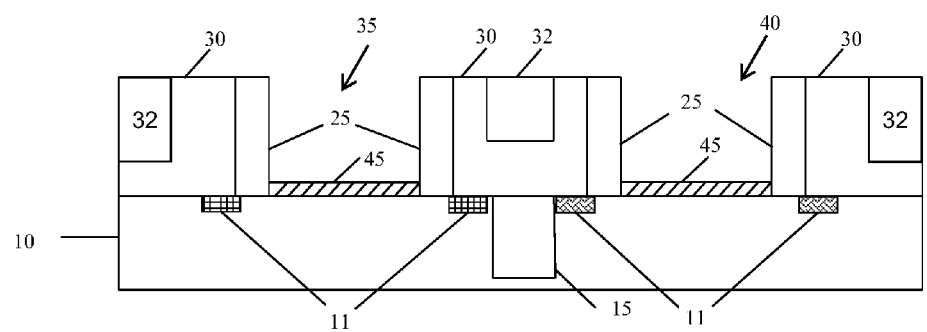
FIGS. 2-4 show structures and respective processing steps in accordance with aspects of the invention.

As shown in FIG. 2, the dummy gate structures, e.g., sacrificial layer 22 and insulator layer 20, are removed using conventional lithographic processes, e.g., RIE processes, to form an nFET trench 35 and a pFET trench 40. A channel material 45 is formed on the substrate 10, in both the nFET trench 35 and pFET trench 40. In embodiments, the channel material 45 is a material with high mobility of charge carriers, for example, SiGe or Ge (hereinafter referred to as channel material). The channel material 45 is grown on the substrate 10 using conventional epitaxial growth processes. In embodiments, the channel material 45 is raised, and has a similar crystalline structure as the substrate 10 due to the growth process. In alternate embodiments, the channel material 45 is deposited on the substrate 10 using any conventional deposition processes. In embodiments, the channel material 45 is about 5 Å to about 250 Å in thickness; although other dimensions are also contemplated by the present invention.

Figure 3:
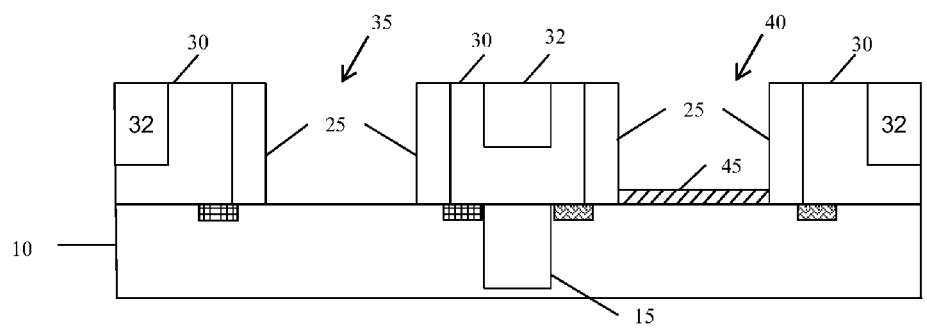

In FIG. 3, the channel material 45 is removed in the nFET trench 35. More specifically, in embodiments, the pFET trench 40 is masked and the channel material 45 is removed from the nFET trench 35 using a chemical dry etch, e.g. $CF_4$.

It should be understood by those of ordinary skill in the art that the channel material 45 in the pFET trench 40 can be removed, instead of the channel material 45 in the nFET trench 35.

Figure 4:
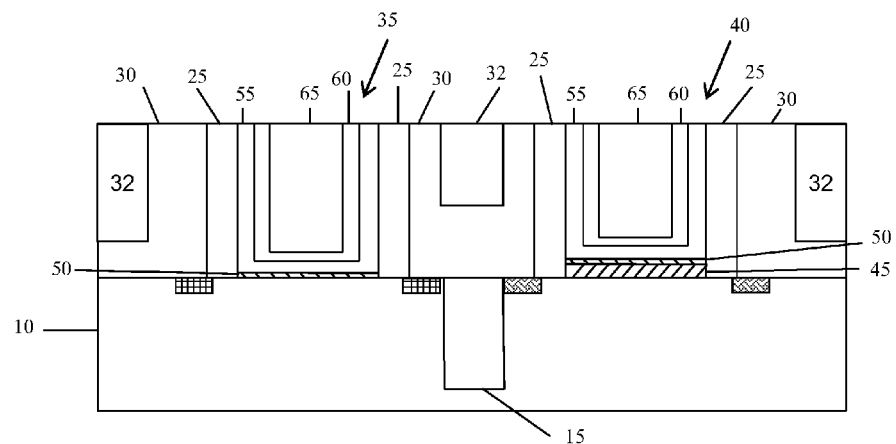

In FIG. 4, several materials are deposited in the trenches 35 and 40 to form metal gate structures. These materials are used to form the metal gates of the present invention, including metal materials for tailoring a work function of the metal gates. For example, FIG. 4 shows the trenches 35, 40 filled with an insulating layer 50, e.g., interfacial insulator layer, a high-k dielectric layer 55, one or more metallic layers 60, and metal fill 65, e.g., aluminum. In embodiments, the insulating layer 50 can be an oxide material.

In embodiments, the insulating layer 50 is deposited on the channel material 45 in the trench 40. In embodiments, the high-k dielectric layer 55 is deposited on the insulator layer 50 and can be, for example, a hafnium based material such as, hafnium dioxide ($HfO_2$); although other hafnium based dielectric materials are also contemplated by the present invention. Alternatively, the high-k dielectric layer 55 can be HFSIO, or a stack of combinations of such materials with or without oxide materials. The one or more metallic layers 60 can be titanium nitride (TiN), tantalum nitride (TaN), or titanium aluminide (TiAl); although other metals are also contemplated by the present invention, depending on the tailoring of the work function. Accordingly, it should be understood by one of ordinary skill in the art that the metal materials are used for exemplary purposes, and that different materials may be used to fill the trenches. For example, the materials used will depend on the work function defined by the pFET. The metal fill 65, e.g., aluminum is then deposited on the layer 60.

In embodiments, the nFET trench 35 and the pFET trench 40 are filled simultaneously. Accordingly, the nFET trench 35 and pFET trench 40 are filled with the same materials. In alternate embodiments, the nFET trench 35 and pFET trench 40 can be filled with different materials, during different processing steps. For example, the nFET trench 35 can be masked while the pFET trench 40 is filled with materials in a first process, and then, the pFET trench 40 can be masked while the nFET trench 35 is filled with the same or different filler materials in a second process, and vice-versa. As in any of the aspects of the present invention, these materials can be adjusted in thickness and type to tailor the work function of the gate structures.

Figure 5:
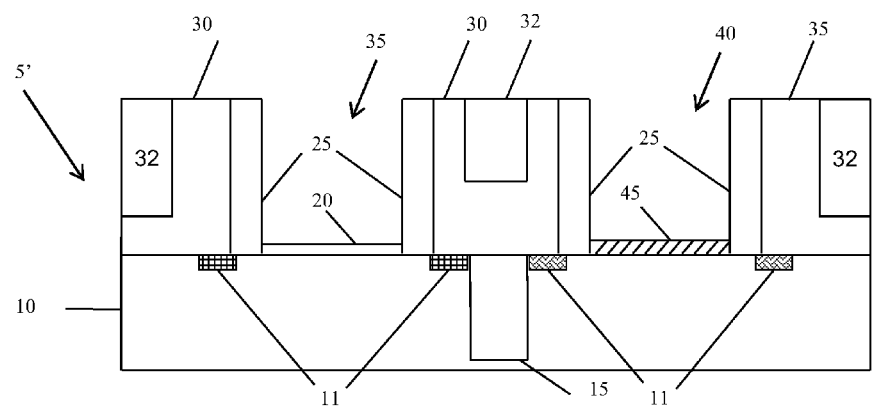
FIGS. 5-6 show additional structures and respective processing steps in accordance with aspects of the invention.

FIG. 5 shows an alternative structure 5' and respective processing steps in accordance with aspects of the invention. Starting from the structure of FIG. 1, the insulating layer in the pFET trench 40 is removed using a conventional RIE process. More specifically, the insulating layer 20 in the nFET trench 35 is masked, and the insulating material within the pFET trench 40 is removed using a conventional RIE process. The mask is then removed, and a channel material 45 is epitaxially grown on the substrate 10 in the pFET trench 40. As should be understood by those of skill in the art, the insulating layer 20 in the nFET trench 35 prevents the formation of channel material 45 in the nFET trench 35. It should be understood by those of ordinary skill in the art that the above process can be reversed in order to form channel material 45 in the nFET trench 35 rather than the pFET trench 40; although other epitaxial materials that enhance nFET electron mobility and nFET work function can be provided in the nFET trench 35. Much like noted above, the channel material 45 will have a similar crystalline structure as the substrate 10 due to the growth process. In embodiments, the channel material 45 is deposited to a thickness of about 5 Å to about 250 Å; although other dimensions are also contemplated by the present invention.

Figure 6:
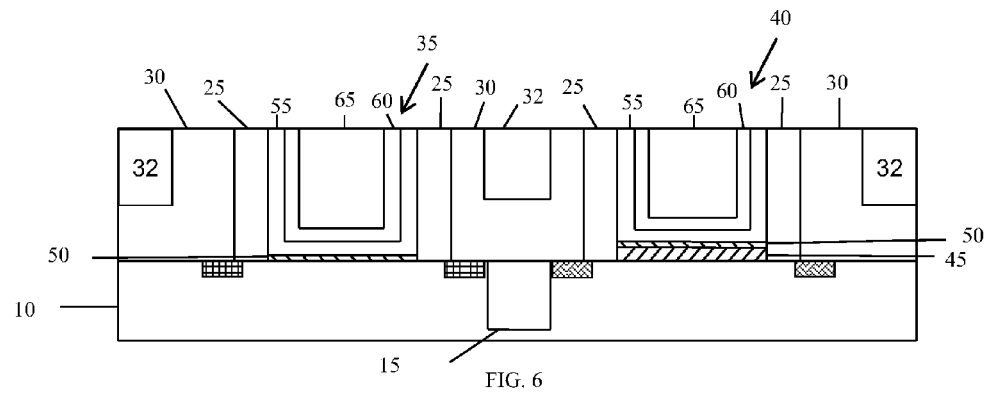

In FIG. 6, the insulating layer 20 of the nFET trench 35 is removed using any well-known etching technique, e.g., wet etching technique. The trenches 35, 40 are then filled with material to form the gate structures, as described above. More specifically, the trenches 35, 40 are filled with an insulating layer 50, a high-k dielectric layer 55, one or more metallic layers 60, and a metal fill 65, e.g., aluminum. In embodiments, the nFET trench 35 and the pFET trench 40 are filled simultaneously, or in separate processes. Accordingly, the nFET trench 35 and pFET trench 40 are filled with the same materials or different materials at the same or different thicknesses to adjust the work functions. For example, in embodiments, the nFET trench 35 can be masked while the pFET trench 40 is filled with materials in a first process, and then, the pFET trench 40 can be masked while the nFET 35 trench is filled with different filler materials in a second process, and vice-versa. In this way, it is possible to adjust the work function metals of the nFET and pFET.

Figure 7:
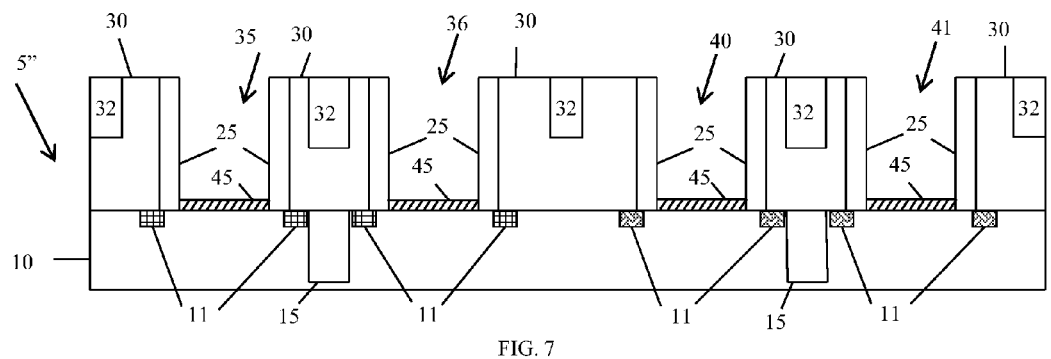
FIGS. 7-10 show additional structures and respective processing steps in accordance with aspects of the invention.

FIG. 7 shows an alternate structure 5" and respective processing steps in accordance with aspects of the invention. In this embodiment, FIG. 7 shows a structure with the insulating layer and sacrificial layer removed to form nFET trenches 35 and 36, and pFET trenches 40 and 41. In embodiments, the insulating layer and sacrificial layer are removed from the trenches 35, 36, 40, 41 by an etching process known to those of skill in the art. FIG. 7 further shows a channel material 45 formed on the substrate 10 in the trenches 35, 36, 40, 41, in the manner described herein, e.g., grown on the substrate 10 to a thickness of about 5 Å to about 250 Å. In embodiments, the channel material 45 is removed from the nFET trenches 35, 36 by an etching process, while the pFET trenches 40, 41 are masked. In alternate embodiments, the channel material 45 can also be removed from one of the pFET trenches, e.g., pFET trench 40 which forms a thick oxide device.

In alternate embodiments, the insulator layer 20 can remain in the nFET trenches 35, 36 in order to act as a mask during the formation of the channel material 45 in the pFET trenches 40, 41. In this alternate embodiment, the insulator layer 20 in the nFET trenches 35, 36 can be removed after formation of the channel material 45 in the pFET trenches 40, 41. It should be understood by one having ordinary skill in the art that this embodiment may be implemented with the channel material 45 formed in the nFET trenches 35, 36 rather than the pFET trenches 40, 41 and the subsequent steps are performed accordingly.

Figure 8:
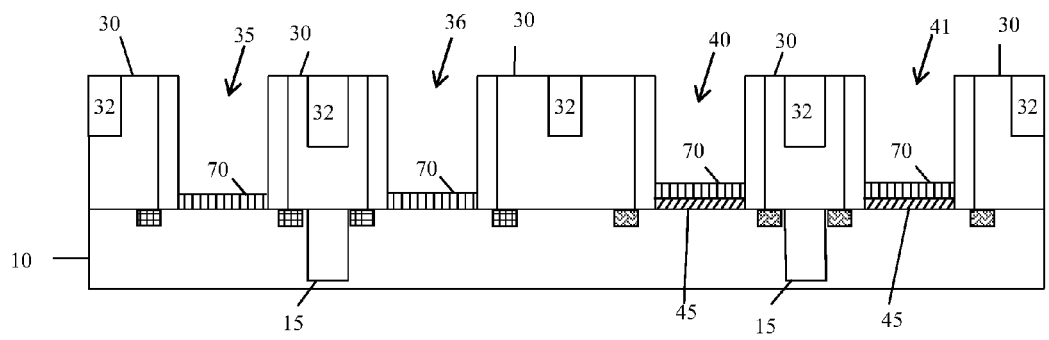

In FIG. 8, the channel material of the nFET trenches 35, 36 is removed in the manner as described above, and a thick oxide layer 70 is formed on the substrate 10 in the nFET trenches 35, 36 and on the channel material 45 in the pFET trenches 40, 41. In embodiments, the thick oxide layer 70 is deposited or grown on a bottom surface of the trenches 35, 36 40, 41, and supports higher voltages for the gate structures. In embodiments, the thick oxide layer 70 is deposited or grown to a thickness of about 20 Å to about 200 Å; although other dimensions are also contemplated by the present invention.

Figure 9:
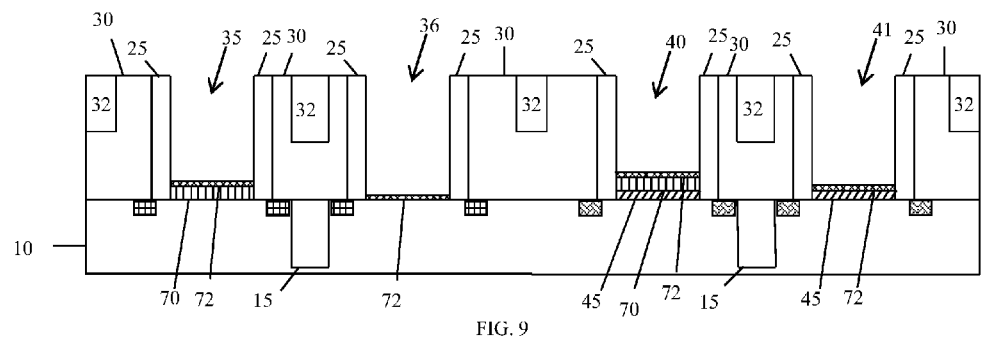

In FIG. 9, the thick oxide layer 70 is removed from thin oxide devices, e.g., the nFET trench 36 and the pFET trench 41. In embodiments, the thick oxide layer 70 can be removed using conventional etching processes, while masking the thick oxide layer 70 within the nFET trench 35 and the pFET trench 40 (e.g., thick oxide devices). Once the thick oxide layer 70 is removed, the mask can be stripped using conventional stripants. FIG. 9 further shows a thin oxide layer 72 formed in the nFET trench 36 and the pFET trench 41. It should be understood that the thin oxide layer 72 can be formed on the thick oxide layer 70, but such additional oxide is negligible compared to the thick oxide layer 70, itself.

Figure 10:
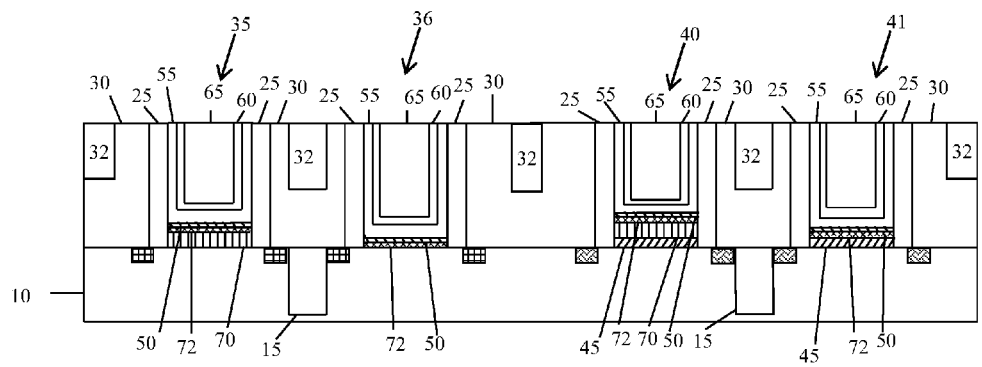

In FIG. 10, the trenches 35, 36, 40, 41 are filled with a plurality of materials, as discussed above. More specifically, the trenches 35, 36, 40, 41 are filled with an insulating layer 50, a high-k dielectric layer 55, one or more metallic layers 60, and metal fill 65, e.g., aluminum. As in the previous aspects of the present invention, these materials can be adjusted in thickness and type to tailor the work function of the gate structures. In this way, pFET devices are formed with a thick oxide layer and a thin oxide layer, both with a channel material.

Figure 11:
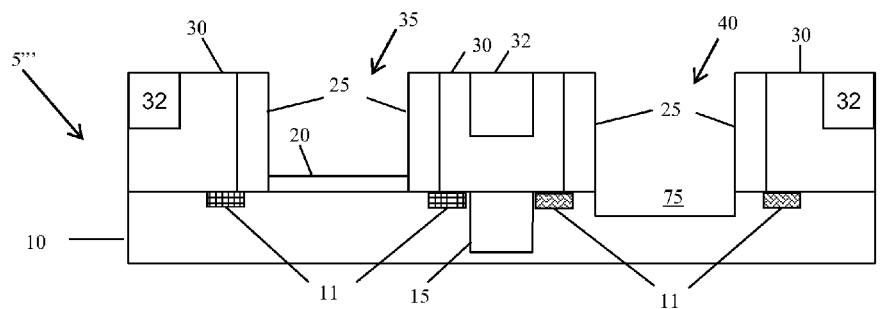
FIGS. 11-13 show additional structures and respective processing steps in accordance with aspects of the invention.

FIG. 11 shows an alternate structure 5''' and respective processing steps in accordance with aspects of the invention. Starting from the structure of FIG. 1, in this embodiment, FIG. 11 shows a recess 75 formed in the pFET trench 40. In embodiments, the recess 75 is formed by removing the sacrificial material in both the nFET trench 35 and pFET trench 40. The nFET trench 35 is then masked, and the pFET trench 40 is etched to remove the insulator layer and a portion of the substrate 10, to form the recess 75 in the substrate 10 . In embodiments, the recess 75 has a depth of about 5 Å to about 250 Å; although other dimensions are contemplated by the present invention. The remaining insulator layer 20 of the nFET trench 35 is used as a mask in later processing steps, to prevent channel material growth (SiGe growth) in the nFET trench 35. It should be understood by one having ordinary skill in the art that this embodiment may be implemented with the recess 75 formed on the nFET trench 35 rather than the pFET trench 40, and the subsequent steps are performed accordingly.

Figure 12:
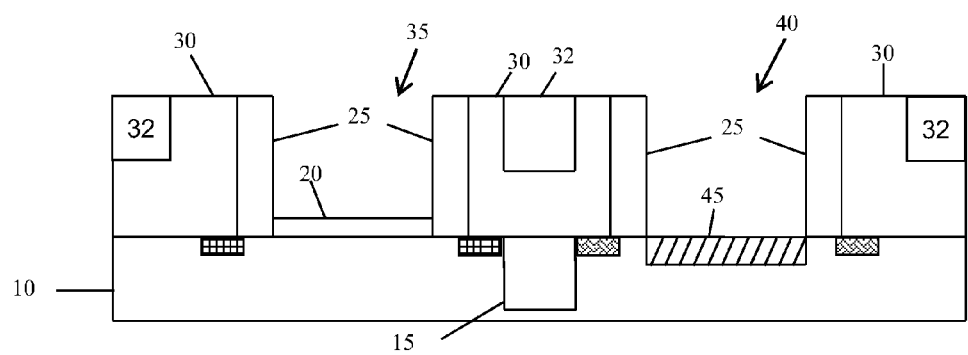

In FIG. 12, a channel material 45 is formed on the substrate 10 and more preferably within the recess 75 of the of the pFET trench 40. In embodiments, the channel material 45 is grown on the substrate 10 to a thickness of about 5 Å to about 250 Å; although other dimensions are contemplated by the present invention. As should be understood, the insulating layer 20 of the nFET trench 35 prevents the formation of channel material 45 in the nFET trench 35.

Figure 13:
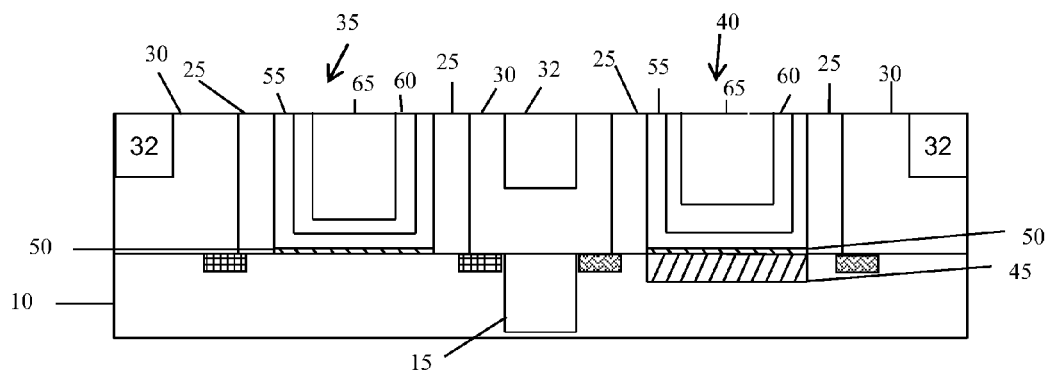

In FIG. 13, the insulating layer 20 of the nFET trench 35 is removed using any well-known etching technique, e.g., wet etching technique. The trenches 35, 40 of FIG. 12 are filled with a plurality of materials as discussed above. More specifically, the trenches 35, 40 are filled with an insulating layer 50, a high-k dielectric layer 55, one or more metallic layers 60, and metal fill 65, e.g., aluminum. As in the previous aspects of the present invention, these materials can be adjusted in thickness and type to tailor the work function of the gate structures.

Figure 14:
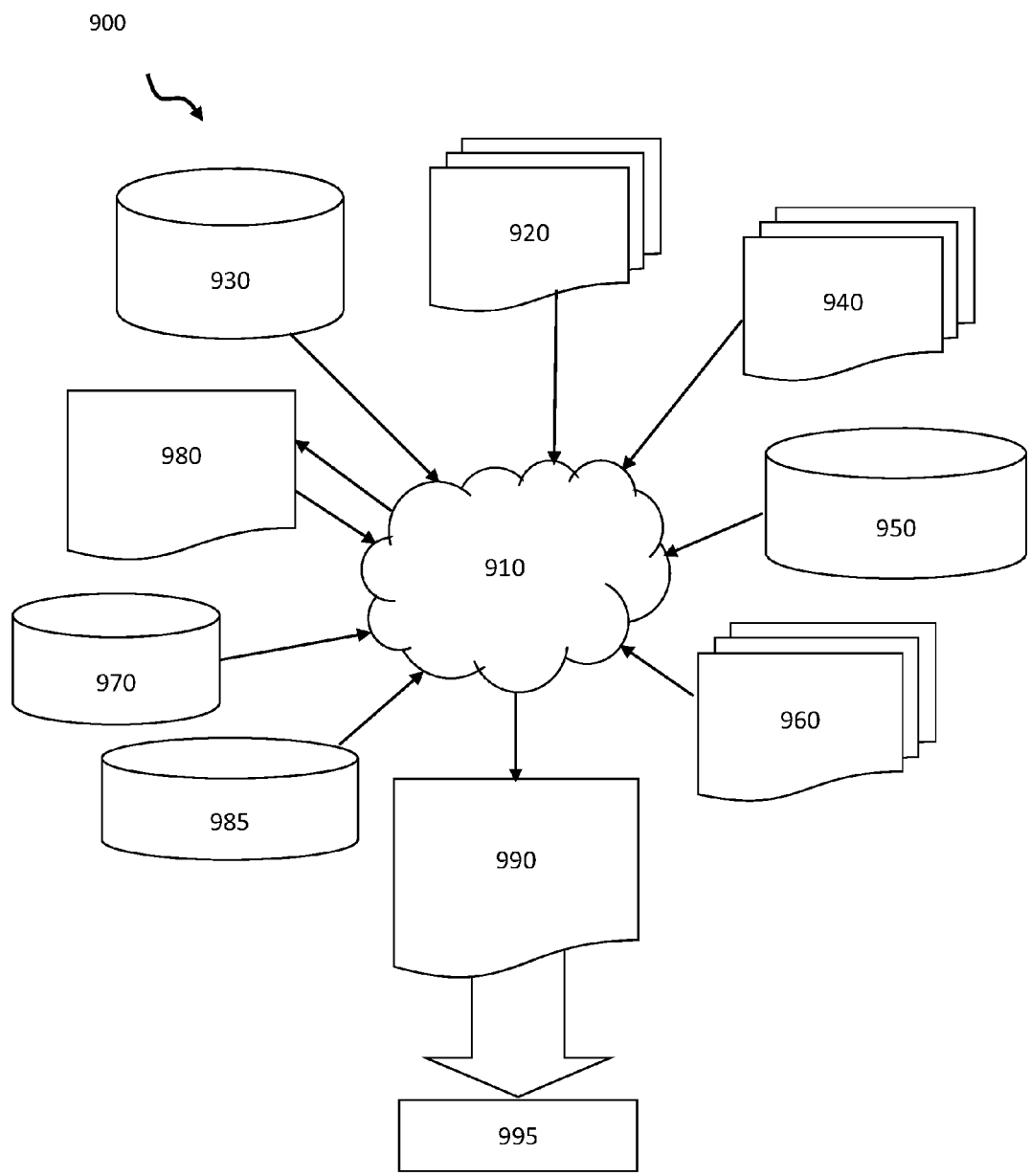
FIG. 14 is a flow diagram of a design process used in semiconductor design, manufacture, and /or test.

FIG. 14 is a flow diagram of a design process used in semiconductor design, manufacture, and/or test. FIG. 14 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-13. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-13. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-13 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-13. In one embodiment, design structure 990 may comprise a compiled, executable HDL simulation model that functionally simulates the devices shown in FIGS. 1-13.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-13. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming an insulator layer on a substrate and a sacrificial layer on the insulator layer;
   patterning the insulator layer and the sacrificial layer to form a plurality of dummy gate structures;
   forming sidewall structures on sidewalls of the dummy gate structures;
   removing the sacrificial layers from a first dummy gate structure and a second dummy gate structure to form a first trench and a second trench, respectively, defined by the sidewall structures;
   removing the insulator layer forming a bottom portion of the second trench while protecting the insulator layer in the first trench;
   forming a channel material on the substrate in the first trench while the insulator layer in the second trench acts as a mask in the second trench;
   removing the insulator layer in the second trench after the channel material is formed; and
   filling remaining portions of the first trench and the second trench with gate material to form a metal gate in each of the first trench and the second trench.

2. The method of claim 1, wherein the channel material is material with high mobility of charge carriers.

3. The method of claim 1, wherein the filling comprises:
   forming an insulating material on the material with high mobility of charge carriers in the first trench and on the substrate in the second trench;
   depositing a high-k dielectric material on the insulating layer in both the first trench and the second trench; and
   depositing metal materials on the high-k dielectric material in both the first trench and the second trench.

4. The method of claim 3, wherein the metal materials are tailored in one of the first trench and the second trench for a work function of the metal gate in the first trench and the second trench.

5. The method of claim 1, further comprising:
   forming a recess in the first trench, wherein:
      the channel material is formed within the recess of the first trench, and the filling comprises:
         forming an insulating material on the channel material within the recess of the first trench and on the substrate in the second trench;

depositing a high-k dielectric material on the insulating material in both the first trench and the second trench; and depositing metal materials on the high-k dielectric material in both the first trench and the second trench.

6. The method of claim 5, wherein the insulating material, high-k dielectric material and metal materials are deposited in the first trench and the second trench during same processing steps.

7. The method of claim 5, wherein the metal materials are tailored in one of the first trench and the second trench for a work function.

8. The method of claim 1, wherein the channel material is formed after the removing the sacrificial layers from the first dummy gate structure and the second dummy gate structure.

9. A method, comprising:

forming dummy gate structures on a substrate;

forming sidewall structures on sidewalls of the dummy gate structures;

removing the dummy gate structures to form a plurality of trenches, defined by the sidewall structures;

forming a channel material in a first trench and a second trench;

forming a thick oxide layer on the channel material in the first trench and the second trench, and on the substrate in a third trench and a fourth trench; and removing the thick oxide layer from the second trench to expose the channel material and the fourth trench to expose the substrate;

forming a thin oxide layer on the channel material in the second trench and the substrate in the fourth trench; and filling remaining portions of the first trench, the second trench, the third trench and the fourth trench with gate material, wherein:

the filling comprises:

forming an insulating material in the first trench, the second trench, the third trench and the fourth trench;

depositing a high-k dielectric material on the insulating material in the first trench, the second trench, the third trench and the fourth trench; and depositing metal materials on the high-k dielectric material in the he first trench, the second trench, the third trench and the fourth trench.

10. The method of claim 9, wherein:

the first trench forms a thick oxide pFET device;

the second trench forms a thin oxide pFET device;

the third trench forms a thick oxide nFET device; and the fourth trench forms a thin oxide nFET device.

11. The method of claim 9, wherein the forming the channel material comprises forming the channel material in the third trench and the fourth trench.

12. The method of claim 11, wherein the channel material in the third trench and the fourth trench are removed prior to the forming of the thick oxide layer.

13. The method of claim 11, wherein the metal materials are tailored in one of the first trench and the second trench for a designed work function.

* * * * *